US008481854B2

(12) United States Patent
Zeng

(10) Patent No.: US 8,481,854 B2
(45) Date of Patent: Jul. 9, 2013

(54) ELECTRONIC COMPONENT DEVICE AND CONNECTOR ASSEMBLY HAVING SAME

(75) Inventor: Hui Zeng, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 269 days.

(21) Appl. No.: 13/116,021

(22) Filed: May 26, 2011

(65) Prior Publication Data

US 2011/0297437 A1 Dec. 8, 2011

(30) Foreign Application Priority Data

Jun. 3, 2010 (CN) .......................... 2010 1 0191298

(51) Int. Cl.
*H05K 5/00* (2006.01)

(52) U.S. Cl.
USPC ............ 174/50; 174/520; 174/559; 220/4.02; 361/679.01

(58) Field of Classification Search
USPC ................. 174/50, 17 R, 520, 535, 559, 560, 174/563, 59, 60, 61; 220/3.2, 3.8, 4.02; 361/600, 679.01; 439/535, 436
See application file for complete search history.

(56) References Cited

U.S. PATENT DOCUMENTS 3,139,314 A * 6/1964 Miller ........................... 439/436
6,118,646 A * 9/2000 Yang et al. .................... 174/520
6,670,552 B2 * 12/2003 Kuroda et al. .................. 174/59
7,880,080 B2 * 2/2011 Lares et al. ...................... 174/50
8,101,874 B2 * 1/2012 Yang ............................. 174/559

FOREIGN PATENT DOCUMENTS

TW M291122 U 5/2006

* cited by examiner

*Primary Examiner* — Angel R Estrada
(74) *Attorney, Agent, or Firm* — Altis Law Group, Inc.

(57) ABSTRACT

An electronic component device for electrically and mechanically connecting to a lead wire includes a base and a cover. The base includes a receiving body, at least one electronic component, and two spaced stripping connectors. The receiving body defining an installation groove. The at least one electronic component and the stripping connectors are received in the receiving body. Each stripping connector is in electrically connected with the at least one electronic component. The stripping connector defines a stripping slot for extension of the core therethrough, which has a size smaller than or equal to the diameter of the core. The cover includes a pressing surface and an electrically insulating cutting body. The cutting body is used for cutting off the lead wire. The pressing surface is configured for pressing the lead wire into the stripping slot, thus making the core in electrical connection with the at least one electronic component.

19 Claims, 10 Drawing Sheets

ELECTRONIC COMPONENT DEVICE AND CONNECTOR ASSEMBLY HAVING SAME

BACKGROUND

1. Technical Field

The present disclosure relates to an electronic component device for electrically and mechanically connecting to a lead wire and a connector assembly having the same.

2. Description of Related Art

Electronic devices such as modems and power supply circuits, a number of electronic components are incorporated. For example, capacitors are likely to be used for noise elimination, or for cutting off a DC signal of a component.

Miniaturization and low-cost are desirable for electronic devices. Accordingly, significant miniaturization and low-cost are desirable for electronic components of the electronic devices. In automatic mounting technology, for reducing the mounting cost and reducing the mounting area, surface mount type electronic components are often utilized instead of soldering components. However, if the number of the electronic components integrated in a printed circuit board is small, the cost of using the surface mount technology to mount the electronic components is too high.

What is needed, therefore, is an electronic component device and a connector assembly having the same which can overcome the above-described problems.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views, and all the views are schematic.

DETAILED DESCRIPTION OF THE EMBODIMENTS

Figure 1:
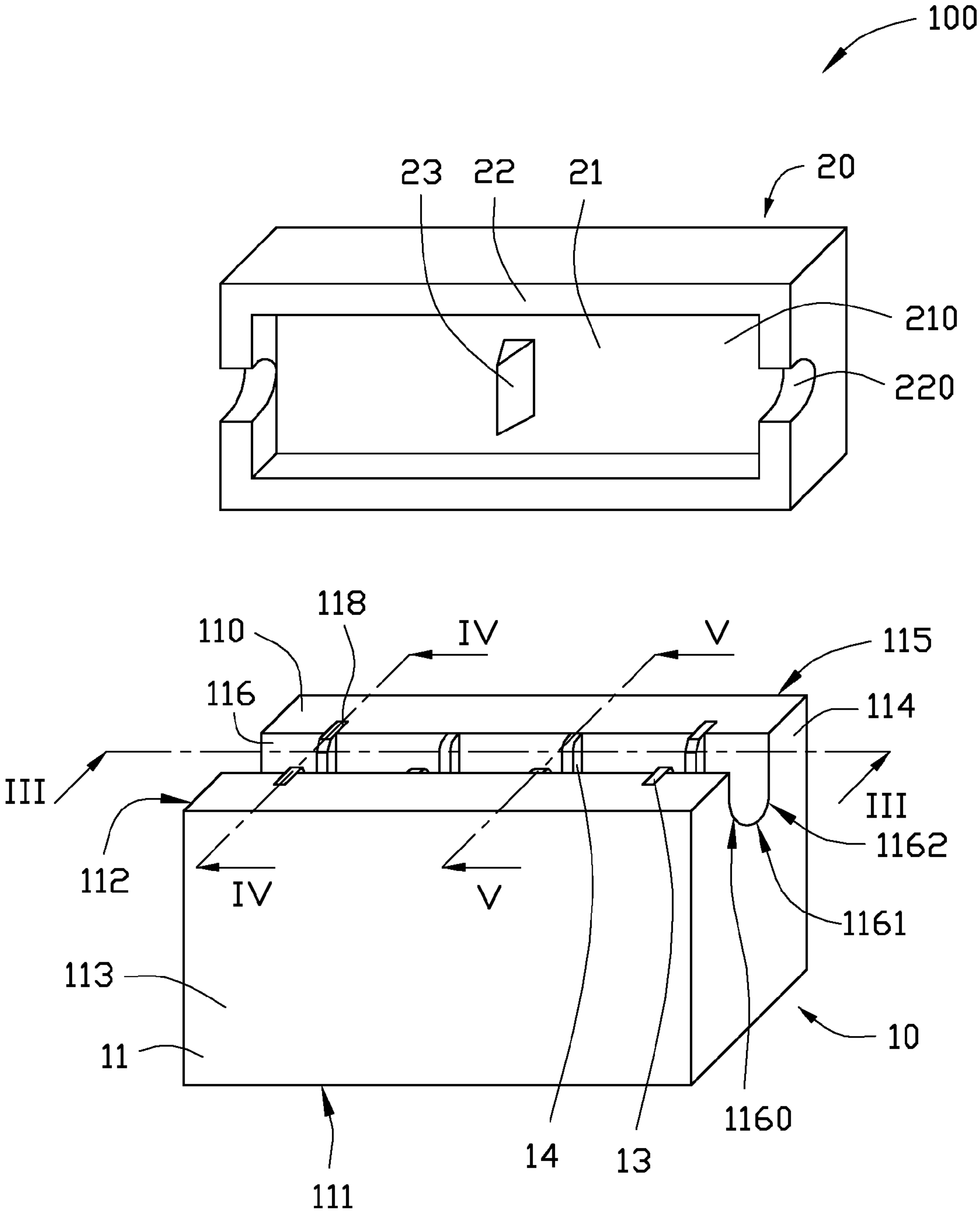
FIG. 1 is a schematic, isometric view of an electronic component device in accordance with a first preferred embodiment, the electronic component device including a base and a cover, in accordance with a first preferred embodiment.
Figure 2:
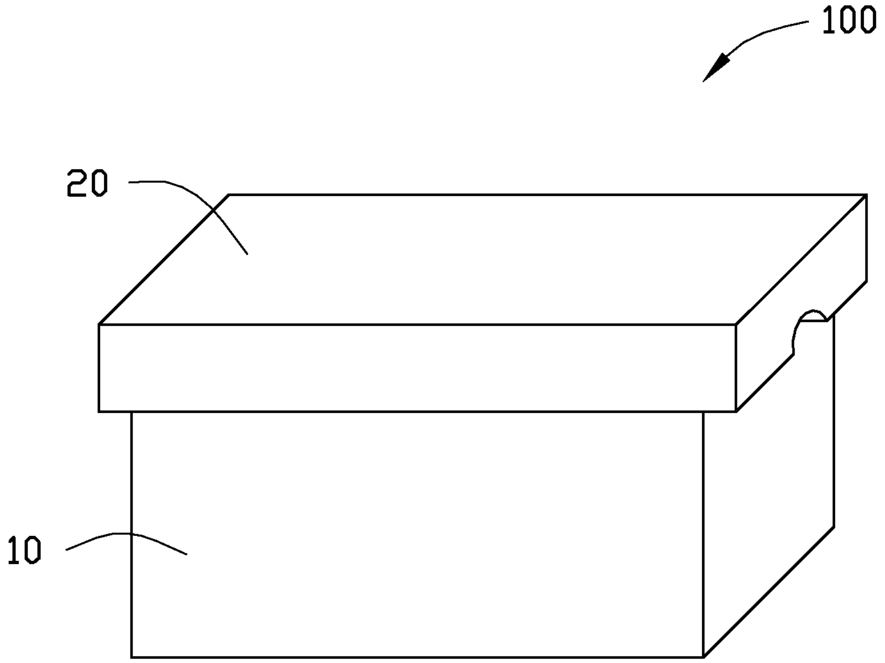
FIG. 2 is similar to FIG. 1, but showing the cover is coupled to the base.
Figure 3:
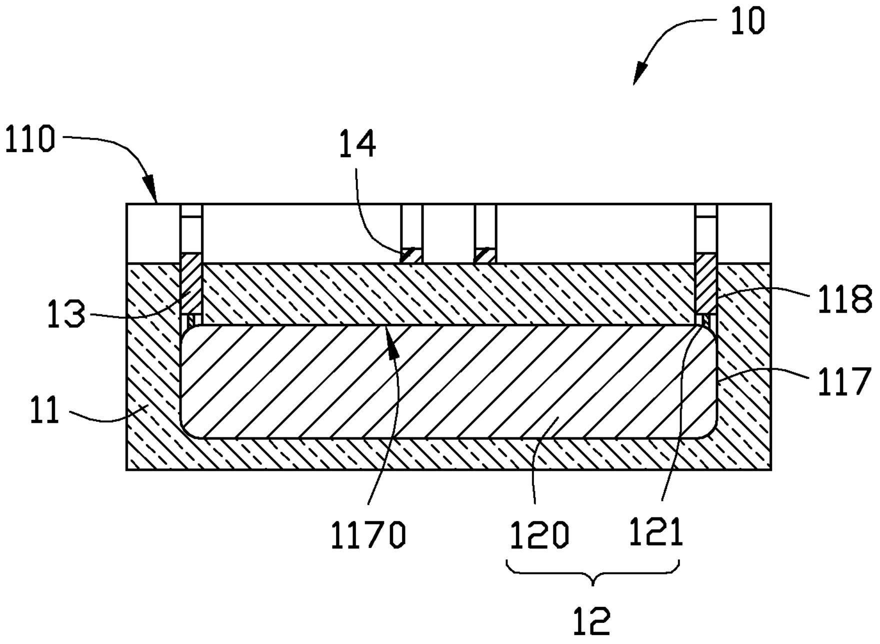
FIG. 3 is a cross sectional view taken along line of FIG. 1.
Figure 4:
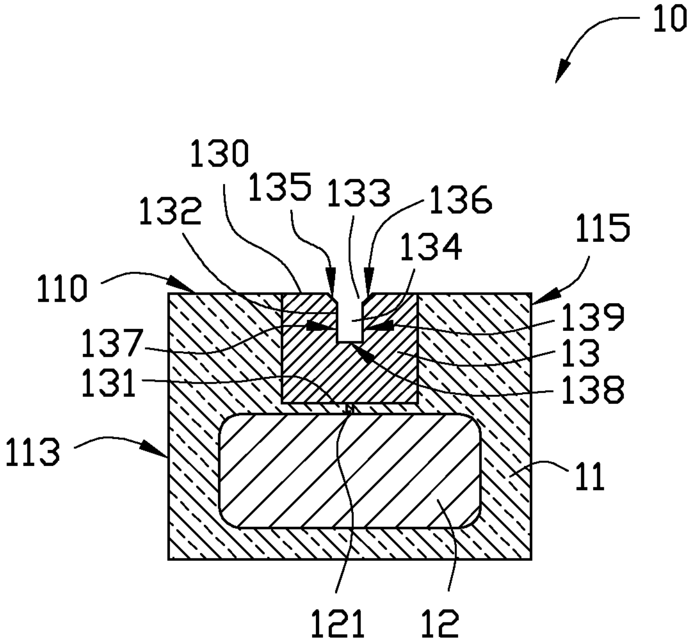
FIG. 4 is a cross sectional view taken along line IV-IV of FIG. 1.
Figure 5:
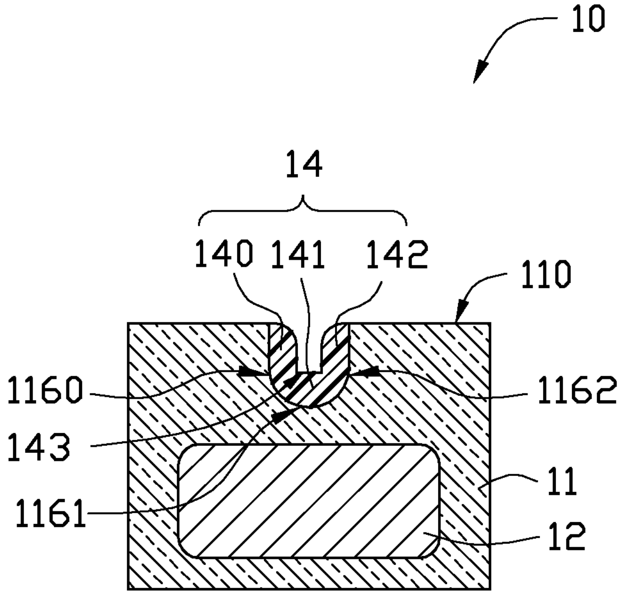
FIG. 5 is a cross sectional view taken along line V-V of FIG. 1.

Various embodiments will now be described in detail below and with reference to the drawings.

Referring to FIGS. 1 to 5, an electronic component device 100 for electrically and mechanically connecting to a lead wire according to a first preferred embodiment includes a base 10 and a cover 20. The base 10 includes a receiving body 11, an electronic component 12, two spaced stripping connectors 13, and two spaced support elements 14. The electronic component 12, stripping connectors 13, and support elements 14 are received in the receiving body 11.

The receiving body 11 is cuboidal, and includes a top surface 110, a bottom surface 111, a first side 112, a second side 113, a third side 114 and a fourth side 115. The bottom surface 111 is opposite to the top surface 110. The first, second, third, and fourth sides 112,113,114, 115 are all in connection between the top and bottom surfaces 110 and 111. The third side 114 faces away from the first side 112. The fourth side 115 faces away from the second side 113.

The receiving body 11 further defines an installation groove 116, a receiving cavity 117, and two communication slots 118. The installation groove 116 is exposed at the top surface 110, that is, the installation groove 116 is a blind slot in the top surface 110 along a direction from the first side 112 to the third side 114, and penetrates through the first and third sides 112 and 114. In this embodiment, the installation groove 116 has a U-shaped section. The installation groove 116 has a first side face 1160, a bottom face 1161 in connection with the first side face 1160, and a second side face 1162 in connection with the bottom face 1161. The first side face 1160 is arranged between the second side 113 and the second side face 1162. The second side face 1162 is arranged between the first side face 1160 and the fourth side 115. The bottom face 1161 is a concave surface. The installation groove 116 located between the top surface 110 and the receiving cavity 117. The receiving cavity 117 located between the installation groove 116 and the bottom surface 111. The receiving cavity 117 has an inner surface 1170. The two communicating slots 118 are in communication with the installation groove 116 and the receiving cavity 117. Both of the two communicating slots 118 extending from the top surface 110 to the inner surface 1170. The communicating slot 118 has a rectangular section.

The electronic component 12 is received in the receiving cavity 117. The electronic component 12 can be a resistance, a capacitance, an inductance, a transformer or other electronic components. The electronic component 12 includes a main body 120 and two contacting pins 121 arranged on the main body 120. The two contacting pins 121 are electrically connected to the main body 120, and inserted in the corresponding communicating slots 118.

The two stripping connectors 13 are comprised of an electrically conductive material. The two stripping connectors 13 are partly accommodated in the corresponding communication slots 118. At least part of the stripping connector 13 is in the installation groove 116. The two stripping connectors 13 are respectively in contact with the two contacting pins 121 of the electronic component 12, thus in electrical connection with the two contacting pins 121 of the electronic component 12. Both of the two stripping connectors 13 includes a first end 130 and an opposite second end 131. The first end 130 terminates at the top surface 110, the second end 131 is in contact with the corresponding contacting pin 121, thus in electrical connection with the electronic component 12. Both of the two stripping connectors 13 include a stripping blade 132 exposed at the installation groove 116. The stripping blade 132 define a guiding slot 133 and a stripping slot 134 for extension of the core therethrough. The stripping slot 134 is in communication with the guiding slot 133.

The guiding slot 133 is arranged between the top surface 110 and the stripping slot 134. The guiding slot 133 includes a first guiding surface 135 and an opposite second guiding surface 136. The first guiding surface 135 is arranged between the second side 113 and the second guiding surface 136. The second guiding surface 136 is arranged between the first guiding surface 135 and the fourth side 115. The first and second guiding surfaces 134, 135 are inclined to the first end 130, thereby cooperatively forming the guiding slot 133 with a trapeziform section. The first and second guiding surfaces 134, 135 are adapted for being in contact with the lead wire and guide it into the stripping slot 134.

Figure 8:
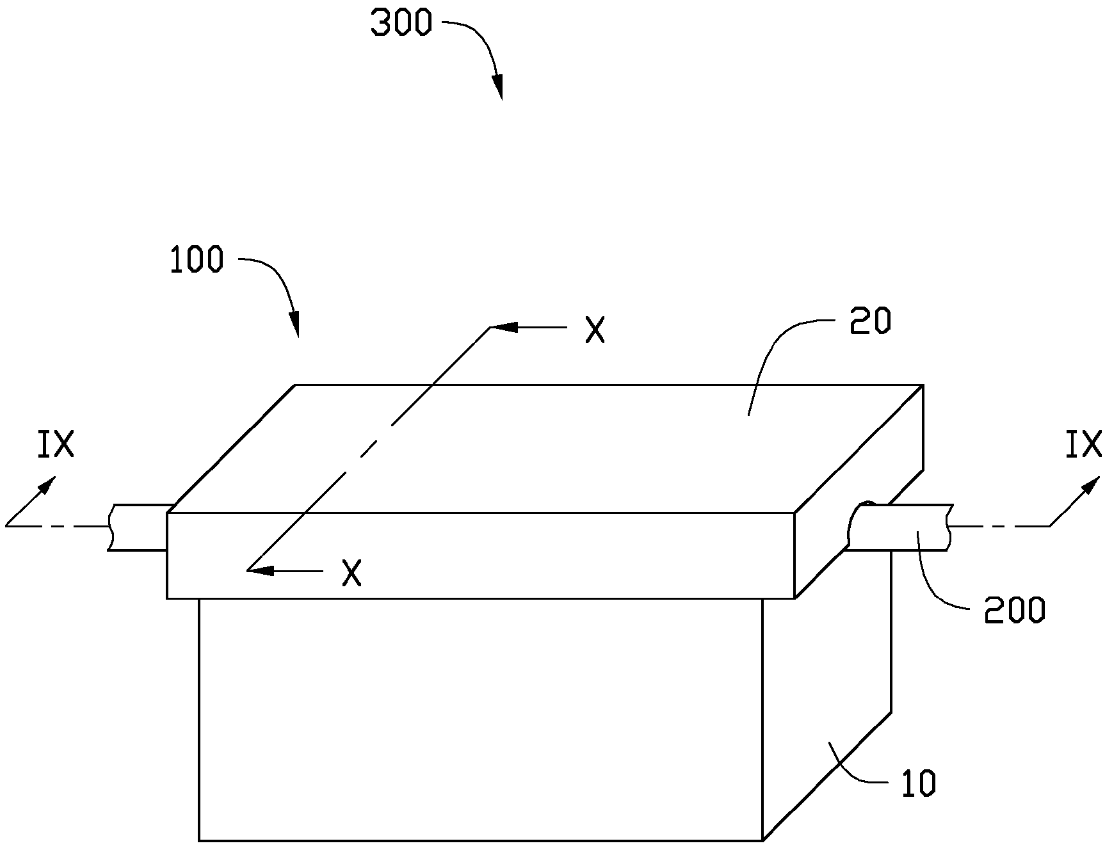
FIG. 8 is a connector assembly in accordance with a fourth preferred embodiment, the apparatus including the device of FIG. 2 and a lead wire in electrically and mechanically connection with the device.

The stripping slot 134 is arranged between the guiding slot 133 and the bottom surface 111. The stripping slot 134 has a width less than or equal to the diameter of the core of the lead wire (the lead wire 200 as shown in FIG. 8). The stripping slot 134 includes a first stripping surface 137, a contact surface 138, and a second stripping surface 139 opposite to the first stripping surface 137. The first stripping surface 137 connects the first guiding surface 135 and the contact surface 138. The contact surface 138 is parallel with the top surface 110. The distance between the first end 130 and the contact surface 138 is preferred to be less than or equal to the diameter of the lead wire. The second stripping surface 139 connects the contact surface 138 and the second guiding surface 136. The width of the stripping slot 134 is less than or equal to the diameter of the core of the lead wire, that is, the distance between the first and second stripping surfaces 136 and 138 is less than or equal to the diameter of the core of the lead wire.

The two support elements 14 are formed in the installation groove 116 between the two stripping connectors 13. The two support elements 14 are spaced apart from each other. The two support elements 14 are adapted for supporting the portion of the lead wire between the two stripping connectors 13. Each of the two support elements 14 includes a first arm 140, a connecting arm 141, and a second arm 142. The first arm 140 is in contact with the first side face 1160. The second arm 142 is opposite to the first arm 140, and is in contact with the second side face 1162. The connecting arm 141 is in connection with the first and second arms 140, 142 and is in contact with the bottom face 1161. The connecting arm 141 includes a supporting surface 143 for supporting the lead wire. The supporting surface 143 is substantially parallel with the contact surface 138 of the stripping connectors 13, and is arranged between the contact surface 138 and the top surface 110.

The cover 20 is adapted for detachability coupling with the base 10. The cover 20 includes a pressing board 21, a coupling frame 22, and an electrically insulating cutting body 23. The pressing board 21 is cuboid and includes a pressing surface 210. The pressing surface 210 is configured for covering the installation groove 116. The stripping blade 132 is configured for splitting the shell at the spitting slot 134 thus enable the core to be electrically connected with the electronic component 12. The coupling frame 22 extends along a peripheral margin region of the pressing surface 210. The coupling frame 22 is combined with the base 10. The coupling frame 22 defines two coupling openings 220 corresponding to the lead wire. The cutting body 23 protrudes from the pressing surface 210 in a central region of the pressing surface 210. The cutting body 23 is configured for cutting a portion of the lead wire between the stripping connectors 13 into two pieces. In this embodiment, the cutting body 23 is arranged between the two support elements 14 when the cover 20 covers the base 10. The length of the cutting body 23 is larger than the width of the lead wire, and smaller than the width of the installation groove 116. In the present embodiment, the cutting body 23 is triangular prism-shaped.

It is noted that the base 10 and the cover 20 can also be combined together by bonding, and is not limited to this embodiment.

Figure 6:
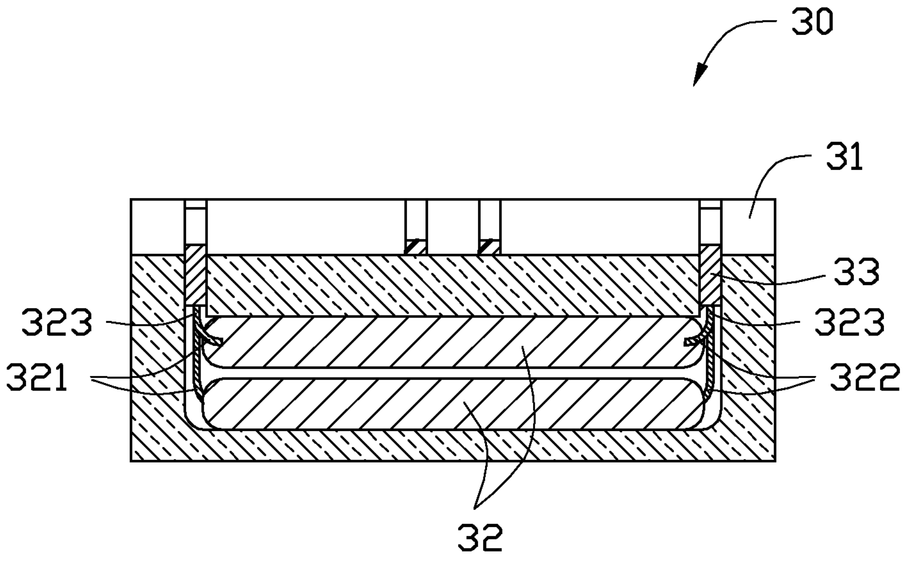
FIG. 6 is a cross sectional view of a base similar to FIG. 3, but showing two electronic components in parallel connection with each other in the base, in accordance with a second preferred embodiment.

Referring to FIG. 6, a base 30 is provided in a second preferred embodiment. The base 30 is similar to the base 10 of the first preferred embodiment as shown in FIGS. 1 to 5, but two electronic components 32 in parallel connection with each other are received in the receiving body 31. Both of the two electronic components 32 include a first connecting pin 321 and a second connecting pin 322. The two first connecting pins 321 are both electrically connected with a contacting pin 323. The two second connecting pins 323 are both electrically connected with another contacting pin 323. The two contacting pins 323 are respectively in contact with the two stripping connectors 33.

The number of the electronic components 32 is not limited to be two, more than two electronic components 32 can also be added.

Figure 7:
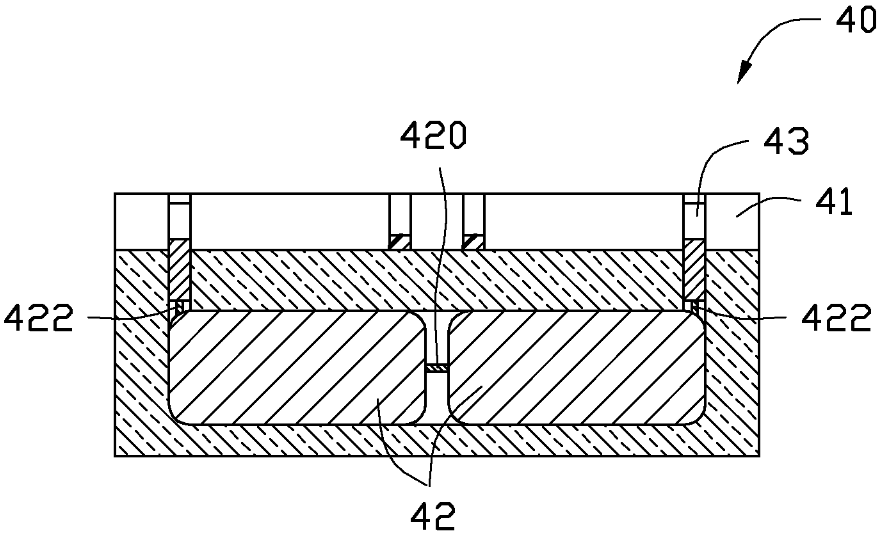
FIG. 7 is a cross sectional view of a base similar to FIG. 3, but showing two electronic components in series connection with each other in the base, in accordance with a third preferred embodiment.

Referring to FIG. 7, a base 40 is provided according to a third preferred embodiment. The base 40 is similar to the base 10 of the first preferred embodiment as shown in FIGS. 1 to 5, but two electronic components 42 in series connection with each other are received in the receiving body 41. The plurality of electronic components 42 constitutes a series. An inner connector 420 connects the two electronic components 42. One electronic component 42 includes a contacting pin 422, the other electronic component 42 includes another contacting pin 422, and the two contacting pins 422 are respectively in contact with the two stripping connectors 43.

The number of the electronic components 42 is not limited to two, more than two electronic components 42 can also be added. That is, more than one inner connector 420 can connect the electronic components 42. One electronic component 42 on one end of the series includes a contacting pin 422, another electronic component 42 on the other end of the series includes another contacting pin 422, and the two contacting pins 422 are respectively in contact with the two stripping connectors 43.

Figure 9:
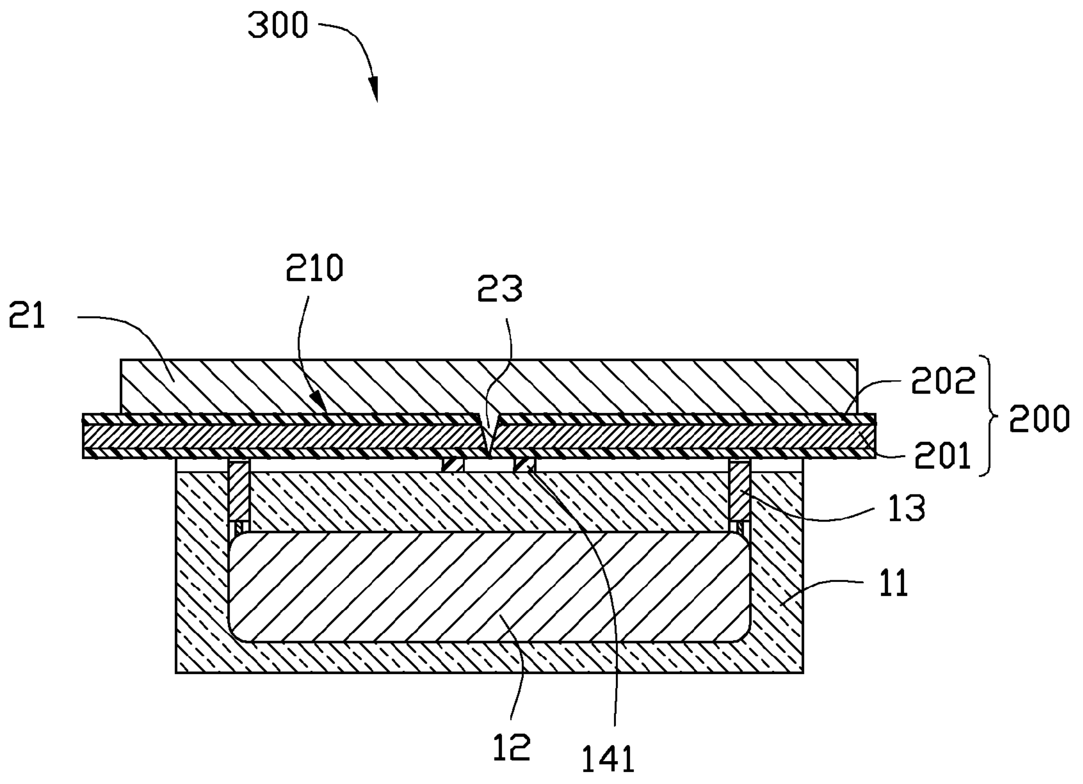
FIG. 9 is a cross sectional view taken along line IX-IX of FIG. 8.
Figure 10:
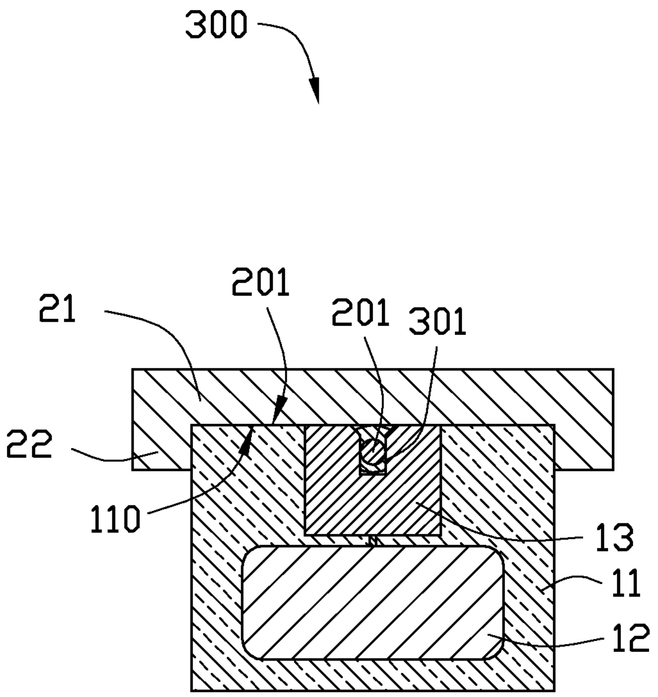
FIG. 10 is a cross sectional view taken along line X-X of FIG. 8.

Referring to FIGS. 8 to 10, a connector assembly 300 is provided in a fourth preferred embodiment. The connector assembly 300 includes the electronic component device 100 as shown in FIGS. 1 to 5 and a lead wire 200 in electrically and mechanically connection with the device 100.

The lead wire 200 includes a core 201 and an electrically insulating shell 202 covering the core 201. The lead wire 200 is received in the installation groove 116. A portion of the lead wire 200 between the stripping connectors 13 is cut apart and separated by the cutting body 23. A split 301 is formed in a portion of the shell 202 at the spitting slot 134 by the stripping blade 132, the core 201 is electrically connected with the electronic component 12 via the stripping blade 132.

It is believed that the present embodiments and their advantages will be understood from the foregoing description, and it will be apparent that various changes may be made thereto without departing from the spirit and scope of the present disclosure or sacrificing all of its material advantages, the examples hereinbefore described merely being preferred or exemplary embodiments of the present disclosure.

The invention claimed is:

1. An electronic component device for electrically and mechanically connecting to a lead wire, the lead wire comprising a core and an electrically insulating shell covering the core, the device comprising:

a base comprising:

a receiving body defining an installation groove for receiving the lead wire;

at least one electronic component received in the receiving body; and two spaced stripping connectors received in the receiving body, each of the stripping connectors being in electrical connection with the at least one electronic component, each of the stripping connectors including a stripping blade having a stripping slot defined therein for extension of the core therethrough, the stripping slot having a width smaller than or equal to the diameter of the core; and a cover comprising a pressing surface and an electrically insulating cutting body protruding from the pressing surface, the cutting body configured for cutting a portion of the lead wire between the stripping connectors into two pieces, the pressing surface configured for covering the installation groove, the stripping blade configured for splitting the shell at the spitting slot thus enable the core to be electrically connected with the electronic component.

2. The device of claim 1, wherein the base further comprises a top surface and an opposite bottom surface, the installation groove being exposed at the top surface, the base includes a receiving cavity, the at least one electronic component received in the receiving cavity, the installation groove located between the top surface and the receiving cavity, the receiving cavity located between the installation groove and the bottom surface.

3. The device of claim 2, wherein the receiving body further comprises two communicating slots being in communication with the installation groove and the receiving cavity, the stripping connectors received in the corresponding communication slots.

4. The device of claim 3, wherein the receiving cavity includes an inner surface, the communicating slots extending from the top surface to the inner surface.

5. The device of claim 3, wherein the at least one electronic component includes two contacting pins inserted in the corresponding communicating slots, the contacting pins being in electrical connection with the respective stripping connectors.

6. The device of claim 5, wherein the at least one electronic component is a single electronic component, the electronic component electrically connected to the contacting pins.

7. The device of claim 5, wherein the at least one electronic component comprises a plurality of electronic components in parallel connection with each other.

8. The device of claim 5, wherein the at least one electronic component comprises a plurality of electronic components in series connection with each other.

9. The device of claim 5, wherein each of the stripping connectors includes a first end and an opposite second end, the first end terminates at the top surface, the second end is in contact with the corresponding contacting pin.

10. The device of claim 1, wherein the base further comprises two support elements formed in the installation groove, and the support elements are spaced apart from each other, the support elements are configured for supporting a portion of the lead wire between the stripping connectors.

11. The device of claim 1, wherein a height of the electrically insulating cutting body relative to the pressing surface is larger than the width of the lead wire, and smaller than the width of the installation groove.

12. A connector assembly comprising:

a lead wire comprising a core and an electrically insulating shell covering the core; and an electronic component device comprising:

a base comprising:

a receiving body defining an installation groove receiving the lead wire;

at least one electronic component received in the receiving body; and two spaced stripping connectors received in the receiving body, each of the stripping connectors being in electrical connection with the at least one electronic component, each of the stripping connectors including a stripping blade having a stripping slot defined therein for extension of the core therethrough, the stripping slot having a width smaller than or equal to the diameter of the core; and a cover comprising a pressing surface and an electrically insulating cutting body protruding from the pressing surface, a portion of the lead wire between the stripping connectors being cut apart and separated by the cutting body, the pressing surface covering the installation groove, a split being formed in a portion of the shell at the spitting slot by the stripping blade, the core being electrically connected with the electronic component via the stripping blade.

13. The apparatus of claim 12, wherein the base further comprises a top surface and an opposite bottom surface, the installation groove being exposed at the top surface, the base includes a receiving cavity, the at least one electronic component received in the receiving cavity, the installation groove located between the top surface and the receiving cavity, the receiving cavity located between the installation groove and the bottom surface.

14. The apparatus of claim 13, wherein the receiving body further comprises two communicating slots being in communication with the installation groove and the receiving cavity, the stripping connectors received in the corresponding communication slots.

15. The apparatus of claim 14, wherein the receiving cavity includes an inner surface, the communicating slots extending from the top surface to the inner surface.

16. The apparatus of claim 14, wherein the at least one electronic component includes two contacting pins inserted in the corresponding communicating slots, the contacting pins being in electrical connection with the respective stripping connectors.

17. The apparatus of claim 16, wherein each of the stripping connectors includes a first end and an opposite second end, the first end terminates at the top surface, the second end is in contact with the corresponding contacting pin.

18. The apparatus of claim 12, wherein the base further comprises two support elements formed in the installation groove, and the support elements are spaced apart from each other, the support elements are configured for supporting a portion of the lead wire between the stripping connectors.

19. The apparatus of claim 12, wherein a height of the electrically insulating cutting body relative to the pressing surface is larger than the width of the lead wire, and smaller than the width of the installation groove.

* * * * *